United States Patent
Lee et al.

(10) Patent No.: US 7,488,974 B2
(45) Date of Patent: Feb. 10, 2009

(54) ORGANIC LIGHT EMITTING DISPLAY INCLUDING TRANSPARENT CATHODE

(75) Inventors: Young-gu Lee, Seoul (KR); Tae-sik Oh, Suwon-si (KR); Sung-kee Kang, Seongnam-si (KR); Ho-nyeon Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/442,874

(22) Filed: May 30, 2006

(65) Prior Publication Data
US 2007/0176169 A1    Aug. 2, 2007

(30) Foreign Application Priority Data
Jan. 27, 2006    (KR)    .................. 10-2006-0009012

(51) Int. Cl.
*H01L 33/00*    (2006.01)
*H01L 21/00*    (2006.01)

(52) U.S. Cl. ............... 257/40; 257/88; 257/E51.019; 257/E51.021; 438/34; 438/99

(58) Field of Classification Search .............. 257/40, 257/88; 438/34, 99
See application file for complete search history.

(56) References Cited

U.S. PATENT DOCUMENTS
6,014,196 A * 1/2000 Anzaki et al. ............... 349/137

FOREIGN PATENT DOCUMENTS
KR        1020040104172        12/2004

* cited by examiner

*Primary Examiner*—Evan Pert
(74) *Attorney, Agent, or Firm*—Cantor Colburn LLP

(57) ABSTRACT

A top emission type organic light emitting display includes an organic light emitting diode in which an anode, a light emitting layer and a transparent cathode are successively deposited. The cathode has a sandwiched structure in which a transparent oxide layer is inserted between the metal layers. Exemplary embodiments of the cathode of the present invention have better electric conductivity than a conventional cathode of an organic light emitting diode device, and thus has lower power consumption than a conventional top emission organic light emitting display with similar light transmission.

21 Claims, 5 Drawing Sheets

ORGANIC LIGHT EMITTING DISPLAY INCLUDING TRANSPARENT CATHODE

This application claims priority to Korean Patent Application No. 10-2006-0009012, filed on Jan. 27, 2006, and all the benefits accruing therefrom under 35 U.S.C. §119, and the contents of which in its entirety are herein incorporated by reference.

BACKGROUND OF THE INVENTION

1. Field of the Invention

The present invention relates to an organic light emitting display including a transparent cathode, and more particularly, to an organic light emitting display using a transparent cathode for top emission.

2. Description of the Related Art

Generally, organic light emitting displays include organic light emitting diodes ("OLEDs") deposited on thin film transistors ("TFTs") of an electric circuit so that a light emitting layer of a selected OLED emits light in response to a signal controlled by a TFT.

FIG. 1 shows the typical structure of a conventional organic light emitting display. As described above, the conventional organic light emitting display includes an OLED 20 deposited on a TFT layer 10. The OLED 20 includes an anode 21, a light emitting layer 22 and a cathode 23, while the TFT layer 10 includes a substrate 11, a gate electrode 12, a source region 13, a drain region 14 and a via hole 16. Therefore, if a voltage is applied to the gate electrode 12, a current passes through the source region 13 to the drain region 14 while a channel is opened in an organic semiconductor region 15. A current flows to the anode 21 of the OLED 20, the light emitting layer 22 and the cathode 23 through the via hole 16. At this time, in the light emitting layer 22, the action of emitting energy in the form of light occurs as a result of electric coupling, i.e., as a result of the light emitting layer being excited by the recombination of holes and electrons. For example, this light becomes an luminous spot corresponding to one pixel of a display panel.

Reference numeral 30 denotes a passivation layer formed on OLED 20 AND is a protective layer having waterproofing and isolation functions.

In bottom emission devices, light is emitted downward towards the substrate 11, and in top emission devices, light is emitted in the opposite direction. Currently, top emission devices radiating light over a wider area are preferred. That is, in bottom emission devices, the light can be radiated through the gate electrode 12. However, in top emission devices, the light can be emitted through the entire region between lines of a black matrix 24, and thus can provide higher luminance. In order to implement this kind of top emission, the cathode 23 has to be made of a transparent material since the cathode 23 is deposited on the light emitting layer 22. To this end, the cathode 23 is formed of an indium tin oxide (ITO) layer 23$b$ stacked on a silver layer 23$a$. The silver layer 23$a$ is formed to a thickness of about 5 nm and the transparent ITO layer 23$b$ is formed to a thickness of about 50 nm to about 200 nm on the silver layer 23$a$. The cathode 23 has the electric conductivity of metal and light transmission of ITO. That is, the cathode 23 fundamentally has an excellent light transmission characteristic and an appropriate conductivity so as not to increase power consumption. Thus, the cathode 23 is formed as a stack of the ITO layer 23$b$ and the silver layer 23$a$ so as to have these two characteristics.

However, according to an experimental result, such a conventional cathode can transmit only 63% of light on average, as indicated in the graph shown in FIG. 2, and thus luminance is insufficient. The light transmittance can be slightly increased by decreasing the thickness of the silver layer 23$a$. However, this results in a reduction of electric conductivity, and thus power consumption is increased.

Therefore, to solve these problems, a new transparent cathode having an appropriate conductivity and transmittance is desired.

BRIEF SUMMARY OF THE INVENTION

The present invention provides an improved organic light emitting display in which low power consumption and high luminance are realized by using a transparent cathode having an appropriate light transmittance and electric conductivity.

According to an exemplary embodiment of the present invention, there is provided an organic light emitting display having a top emission characteristic. The display includes an organic light emitting diode including: an anode; a light emitting layer that is disposed on the anode and generates light; and a cathode that is disposed on the light emitting layer. The cathode transmits the light produced by the light emitting layer through the cathode and includes at least one sandwiched structure having a transparent oxide layer interposed between metal layers.

The metal layer is composed of at least one of Ag, Au, Al, Ca, Ba, Mg:Ag, Yb and Cr, and the transparent oxide layer is composed of at least one of indium tin oxide (ITO), indium zinc oxide (IZO) and ZnO:Al.

A cathode has a tri-laminar metal layer-transparent oxide layer-metal layer structure. The cathode may have a quadra-laminar metal layer-transparent oxide layer-metal layer-transparent oxide layer structure. Alternatively, the cathode may have a quadra-laminar metal layer-transparent oxide layer-metal layer-transparent oxide layer structure.

It is preferable that the metal layer adjacent to the light emitting layer is thicker than the other metal layer, and the transparent oxide layer adjacent to the light emitting layer is thinner than the other transparent oxide layer. Each of the metal layers has a thickness ranging from about 5 nm to about 7 nm, and the transparent oxide layers has a thickness ranging from about 45 nm to about 55 nm.

According to another exemplary embodiment of the present invention, an organic light emitting display having a top emission characteristic is provided. The display includes: a TFT, the TFT comprising: a substrate; a gate electrode on the substrate; a source region and a drain region; an organic semiconductor area on the gate electrode and source and drain regions; and a via hole through the organic semiconductor area contacting the drain region. The display further includes an organic light emitting diode, the organic light emitting diode includes: an anode; a light emitting layer that is disposed on the anode and generates light; and a cathode that is disposed on the light emitting layer. The cathode transmits the light produced by the light emitting layer through the cathode and includes at least one sandwiched structure that includes a transparent oxide layer interposed between metal layers. The via hole electrically connects the anode and the drain region.

According to yet another exemplary embodiment of the present invention, a method of forming an organic light emitting display having a top emission characteristic is provided. The method includes: forming an organic light emitting diode having an anode; disposing a light emitting layer that generates light on the anode; and disposing a cathode on the light emitting layer. The cathode transmits the light produced by the light emitting layer through the cathode and includes at least one sandwiched structure having a transparent oxide layer interposed between metal layers.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
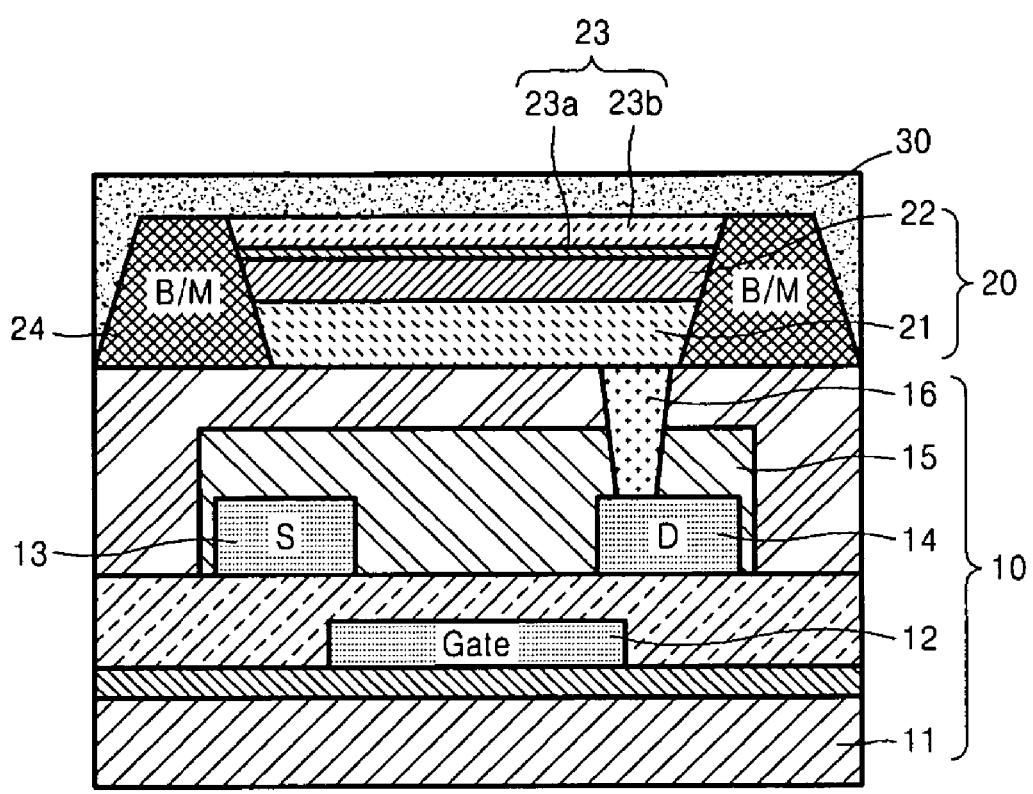
FIG. 1 is a cross-sectional view of a conventional organic light emitting display having a cathode.
Figure 2:
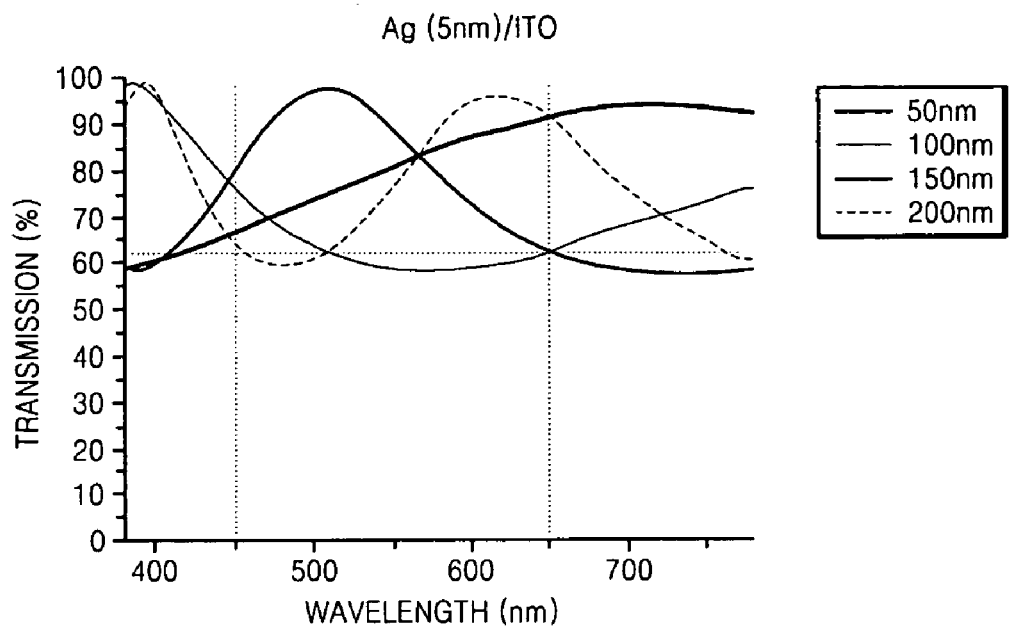
FIG. 2 is a graph of the light transmission of the cathode of the organic light emitting display illustrated in FIG. 1.

Hereinafter, the present invention will be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
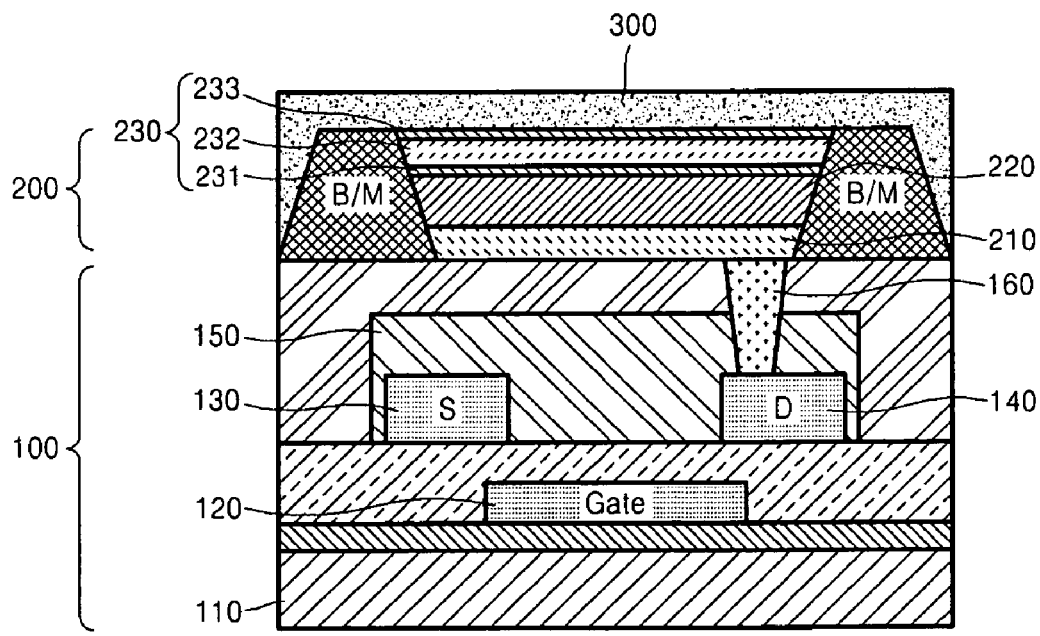
FIG. 3 is a cross-sectional view of an exemplary embodiment of an organic light emitting display having a cathode according to the present invention.

FIG. 3 is a cross-sectional view of an exemplary embodiment of an organic light emitting display having a cathode according to the present invention.

Referring to FIG. 3, the organic light emitting display includes an OLED 200 including an anode 210, a light emitting layer 220 and a cathode 230 sequentially deposited on a TFT 100, which includes a substrate 110, a gate electrode 120, a source region 130, a drain region 140 and a via hole 160. When a voltage is applied to the gate electrode 120, a current passes through the source region 130 to the drain region 140 and a channel is formed in an organic semiconductor area 150. A current flows to the anode 210, the light emitting layer 220 and the cathode 230 through the via hole 160 and light is emitted to a passivation layer 300. The organic light emitting display of the present exemplary embodiment is a top emission display.

The cathode 230 is an electron supplying layer of the light emitting layer 220 and transmits light so that top emission is possible. The cathode 230 has a sandwiched structure in which an indium tin oxide (ITO) layer 232 as a transparent oxide layer is inserted between metal layers 231 and 233, each of the metal layers 231 and 233 composed of a metal such as silver. Such a sandwiched structure provides both high electric conductivity and light transmittance of the cathode 230. That is, the electric conductivity is greatly increased because there are twice as many metal layers as in the conventional art. Also, since the transparent oxide layer 232 composed of a transparent material, such as ITO, is inserted between the metal layers 231 and 233, the light transmittance is high due to quantum tunneling.

Quantum tunneling, a process by which light can pass through an otherwise opaque material, can occur when the transparent oxide layer 232 is inserted between the metal layers 231 and 233. In other words, when the metal layers 231 and 233 are adjacent to each other, the light cannot smoothly penetrate the layers, compared to when only a single metal layer exists. However, when the transparent oxide layer 232, composed of ITO, for example, exists between the metal layers 231 and 233, light can easily penetrate this structure. By taking advantage of this property, the cathode 230 having a sandwiched structure with the transparent oxide layer 232 between the metal layers 231 and 233 provides both improved electric conductivity and improved light transmittance.

Figure 4:
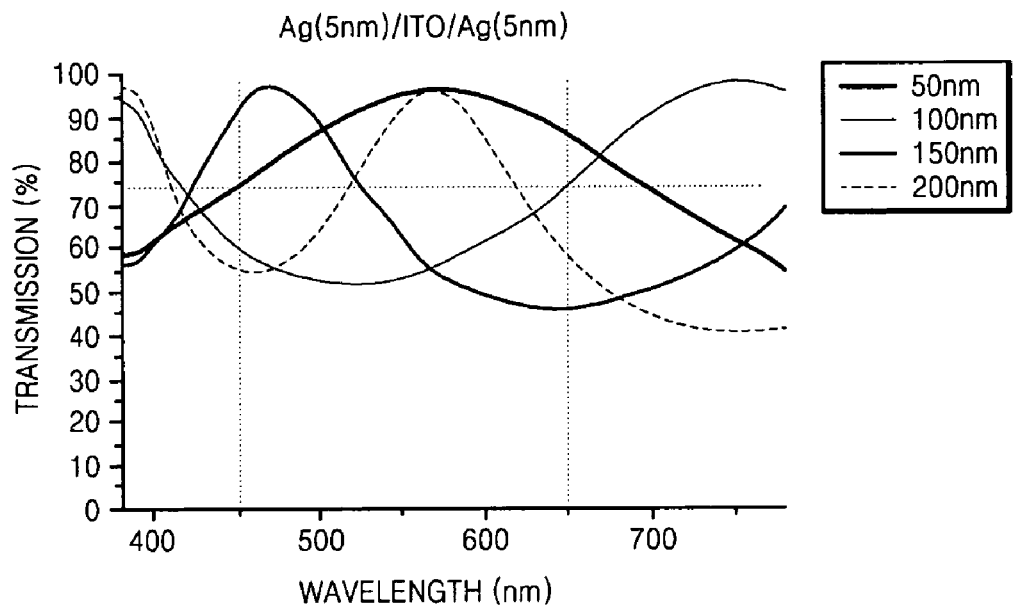
FIGS. 4 and 5 are graphs of the light transmission of the cathode of the organic light emitting display illustrated in FIG. 3.

FIG. 4 is a graph of the light transmission of the cathode 230 in which the upper and lower metal layers 231 and 233 are composed of silver (Ag), and the transparent oxide layer 232 is composed of ITO. Each of the upper and lower metal layers 231 and 233 has a thickness of 5 nm and the transparent oxide layer 232 has a thickness of 50, 100, 150 or 200 nm. The wavelength band for which quantum tunneling occurs depends on the thickness of the ITO layer 232, as indicated by the graph. More than 75% of light was transmitted on average. Only 63% of light is transmitted by a conventional cathode, and thus, it appears that a considerable improvement has been made. According to the graph, when the metal layers 231 and 233 have a thickness of about 5 nm to about 7 nm and the transparent oxide layer 232 has a thickness of about 45 nm to about 55 nm, light transmittance of more than 75% is obtained and the electric conductivity is appropriate. Therefore, the electric conductivity is improved compared to a conventional cathode providing comparable light transmittance, and thus power consumption can be reduced while providing high luminance in the top emission structure.

Figure 5:
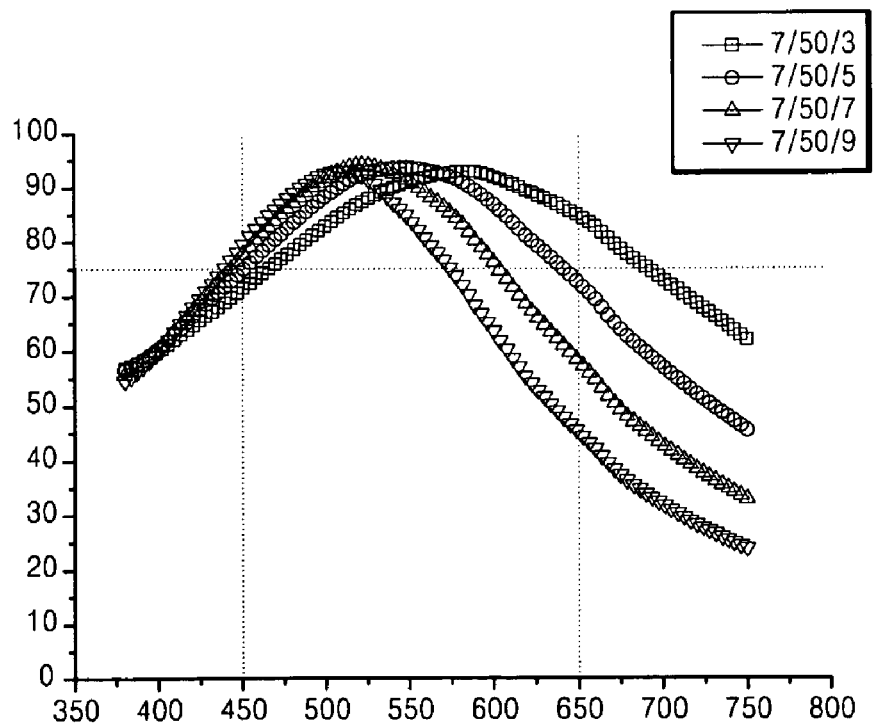

As shown in the graph, the wavelength of the transmitted light changes according to the thickness of each layer. Therefore, for example, if one of red, green and blue light is to have higher transmittance, the thicknesses of the layers are set to transmit the desired wavelength band. FIG. 5 illustrates the light transmission spectrum when varying the thickness of the metal layer 233 to 3, 5, 7 and 9 nm, respectively, while the thickness of the metal layer 231 is fixed at 7 nm and the thickness of the transparent oxide layer 232 is fixed at 50 nm. Referring to FIG. 5, the light transmission varies slightly for the different cases. Therefore, the electric conductivity and light transmittance increases, and further more various light transmission spectra can be obtained by adjusting the thickness of each layer as described above.

Figure 6:
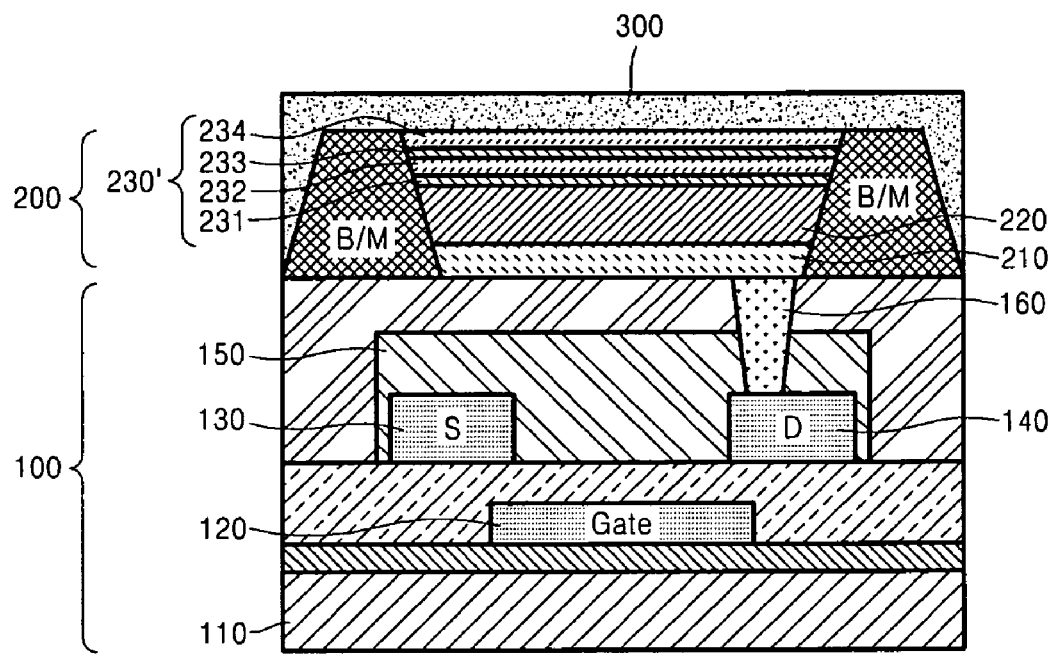
FIG. 6 is a cross-sectional view of another exemplary embodiment of an organic light emitting display having a cathode according to the present invention.

FIG. 6 is a cross-sectional view of another exemplary embodiment of an organic light emitting display according to the present invention. In the drawings, like reference numerals refer to elements performing like functions.

In the present exemplary embodiment, a cathode 230' is made by forming an additional transparent oxide layer 234 on the sandwiched structure of the previous exemplary embodiment of FIG. 3. That is, the transparent oxide layer 234 is deposited onto the uppermost layer of the sandwiched structure including the transparent oxide layer 232 between the metal layers 231 and 233, thus providing a 4 layered Ag-ITO-Ag-ITO structure. This structure can maintain the effect of increasing both the electric conductivity and light transmittance in the sandwiched structure and further allows control with respect to the light transmission spectrum. That is, not only the thickness of the layers in the three-layered sandwiched structure, but also the thickness of the uppermost transparent oxide layer 234 can be adjusted, and thus more various light transmission spectra can be obtained. Therefore, the cathode 230' can be adopted when various light transmission spectra are required. In experimental results, when the cathode 230' with the 4 layered structure was used, the metal layer 231 adjacent to the light emitting layer 220 was thicker than the metal layer 233, and the transparent oxide layer 232 closest to the light emitting layer 220 was thinner than the transparent oxide layer 234, the electric conductivity and light transmission were optimal. Therefore, with this pattern, a top emitting type organic light emitting display in which the light transmission and electric conductivity are excellent can be realized.

Figure 7:
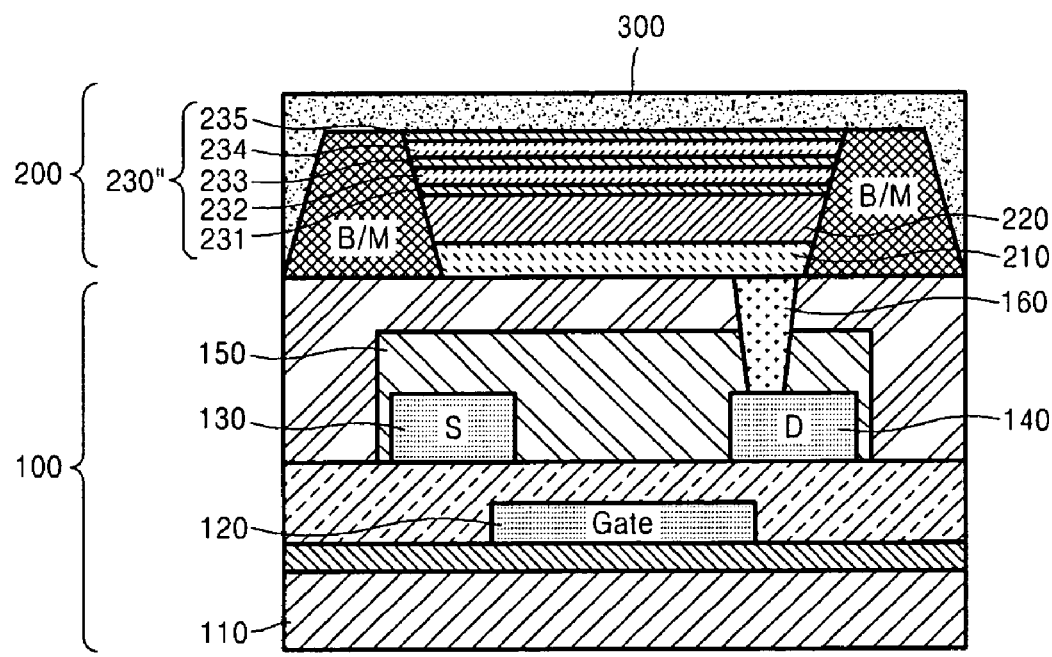
FIG. 7 is a cross-sectional view of yet anther exemplary embodiment of an organic light emitting display according to the present invention.

FIG. 7 is a cross-sectional view of yet another exemplary embodiment of an organic light emitting display according to the present invention. In the drawings, like reference numerals refer to elements performing like functions.

Figure 8:
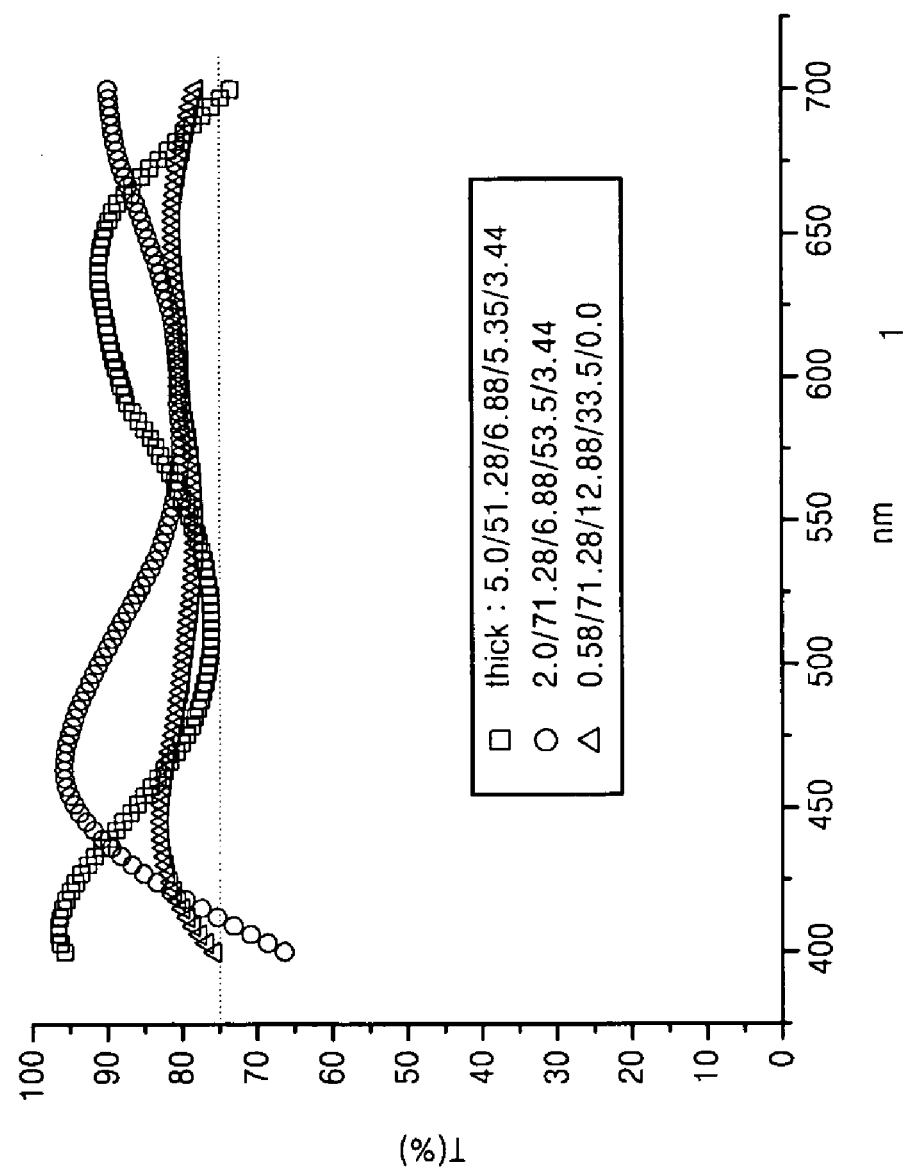
FIG. 8 is a graph of the light transmission of the cathode of the organic light emitting display illustrated in FIG. 7.

Referring to FIG. 7, a cathode 230" has a double sandwiched structure. That is, the cathode 230" has a 5-layered silver 231-ITO 232-silver 233-ITO 234-silver 235 structure, e.g., a double sandwiched structure. Clearly, the sandwiched structure illustrated in FIG. 3 can be repeatedly deposited many times to form a cathode. FIG. 8 is a graph of the light transmission spectrum of the cathode 230". Referring to FIG. 8, while varying the thickness of each layer 231-235, the light transmittance was 75% or greater on average.

Therefore, if the multiple-sandwiched structure is used as in the present exemplary embodiment of FIG. 7, the electric conductivity can be further increased due to the increase in the number of the metal layers and the light transmittance is maintained over 75%. However, since the process of manufacturing the cathode 230" having such a multi-layered sandwiched structure is complicated, it is thus desirable to use this multi-layered sandwiched structure only when a very high light transmittance is required.

In the exemplary embodiments described above, silver (Ag) is selected as the material forming the metal layers 231, 233 and 235 and ITO is selected as the material forming the transparent oxide layers 232 and 234. However, Au, Al, Cr, etc. can also be used to form the metal layers 231, 233 and 235 and indium zinc oxide (IZO), ZnO:Al, etc. can be used to form the transparent oxide layer 232 and 234.

The organic light emitting display according to the present invention as described above includes a cathode with the sandwiched structure including the transparent oxide layer between the metal layers and has the following advantages.

First, the number of metal layers can be increased to improve electric conductivity of the cathode, and thus reduce power consumption.

Second, the light transmission of the cathode is enhanced due to the quantum tunneling effect. Therefore, luminance can be enhanced in a top emission device in which light is transmitted through the cathode.

Third, various light transmission spectra can be obtained by controlling the thickness of each layer of the sandwiched structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display having a top emission characteristic, the display comprising:
   an organic light emitting diode comprising:
   an anode;
   a light emitting layer that is disposed on the anode and generates light; and
   a cathode that is disposed on the light emitting layer, transmits the light produced by the light emitting layer through the cathode and comprises at least one sandwiched structure comprising a transparent oxide layer interposed between metal layers,
   wherein at least one of the metal layers is disposed in contact with the light emitting layer.

2. The organic light emitting display of claim 1, wherein the cathode has a tri-laminar metal layer-transparent oxide layer-metal layer structure.

3. The organic light emitting display of claim 1, wherein the cathode has a quadra-laminar metal layer-transparent oxide layer-metal layer-transparent oxide layer structure.

4. The organic light emitting display of claim 3, wherein the metal layer adjacent to the light emitting layer is thicker than the other metal layer, and the transparent oxide layer more proximate to the light emitting layer is thinner than the other transparent oxide layer.

5. The organic light emitting display of claim 1, wherein the cathode has a penta-laminar metal layer-transparent oxide layer-metal layer-transparent oxide layer-metal layer structure.

6. The organic light emitting display of claim 1, wherein the metal layer is composed of at least one of Ag, Au, Al, Ca, Ba, Mg:Ag, Yb and Cr, and the transparent oxide layer is composed of at least one of indium tin oxide (ITO), indium zinc oxide (IZO) and ZnO:Al.

7. The organic light emitting display of claim 1, wherein each of the metal layers has a thickness ranging from about 5 nm to about 7 nm, and the transparent oxide layers has a thickness ranging from about 45 nm to about 55 nm.

8. An organic light emitting display having a top emission characteristic, the display comprising:
   a TFT, the TFT comprising:
   a substrate;
   a gate electrode on the substrate;
   a source region and a drain region;
   an organic semiconductor area on the gate electrode and source and drain regions; and
   a via hole through the organic semiconductor area contacting the drain region; and
   an organic light emitting diode, the organic light emitting diode comprising:
   an anode;
   a light emitting layer that is disposed on the anode and generates light; and
   a cathode that is disposed on the light emitting layer, transmits the light produced by the light emitting layer through the cathode and comprises at least one sandwiched structure comprising a transparent oxide layer interposed between metal layers,
   wherein the via hole electrically connects the anode and the drain region and,
   wherein at least one of the metal layers is disposed in contact with the light emitting layer.

9. The organic light emitting display of claim 8, wherein the cathode has a tri-laminar metal layer-transparent oxide layer-metal layer structure.

10. The organic light emitting display of claim 8, wherein the cathode has a quadra-laminar metal layer-transparent oxide layer-metal layer-transparent oxide layer structure.

11. The organic light emitting display of claim 10, wherein the metal layer adjacent to the light emitting layer is thicker than the other metal layer, and the transparent oxide layer more proximate to the light emitting layer is thinner than the other transparent oxide layer.

12. The organic light emitting display of claim 8, wherein the cathode has a penta-laminar metal layer-transparent oxide layer-metal layer-transparent oxide layer-metal layer structure.

13. The organic light emitting display of claim 8, wherein the metal layer is composed of at least one of Ag, Au, Al, Ca, Ba, Mg:Ag, Yb and Cr, and the transparent oxide layer is composed of at least one of indium tin oxide (ITO), indium zinc oxide (IZO) and ZnO:Al.

14. The organic light emitting display of claim 8, wherein each of the metal layers has a thickness ranging from about 5 nm to about 7 nm, and the transparent oxide layers has a thickness ranging from about 45 nm to about 55 nm.

15. A method of forming an organic light emitting display having a top emission characteristic, the method comprising:
   forming an organic light emitting diode having an anode;
   disposing a light emitting layer that generates light on the anode; and
   disposing a cathode on the light emitting layer, the cathode transmits the light produced by the light emitting layer through the cathode and comprises at least one sandwiched structure comprising a transparent oxide layer interposed between metal layers,
   wherein the disposing the cathode on the light emitting layer includes disposing at least one of the metal layers in contact with the light emitting layer.

16. The method of claim 15, further comprising forming the cathode as a tri-laminar metal layer-transparent oxide layer-metal layer structure.

17. The method of claim 15, further comprising forming the cathode as a quadra-laminar metal layer-transparent oxide layer-metal layer-transparent oxide layer structure.

18. The method of claim 17, further comprising forming the metal layer adjacent to the light emitting layer thicker than the other metal layer, and forming the transparent oxide layer more proximate to the light emitting layer thinner than the other transparent oxide layer.

19. The method of claim 15, further comprising forming the cathode as a penta-laminar metal layer-transparent oxide layer-metal layer-transparent oxide layer-metal layer structure.

20. The method of claim 15, wherein the metal layer is composed of at least one of Ag, Au, Al, Ca, Ba, Mg:Ag, Yb and Cr, and the transparent oxide layer is composed of at least one of indium tin oxide (ITO), indium zinc oxide (IZO) and ZnO:Al.

21. The method of claim 15, further comprising forming each of the metal layers with a thickness ranging from about 5 nm to about 7 nm, forming the transparent oxide layers with a thickness ranging from about 45 nm to about 55 nm.

* * * * *